United States Patent [19]

Phillips

[11] 4,369,223

[45] Jan. 18, 1983

[54] PREIMPREGNATED MATERIALS COMPRISING VISIBLE-LIGHT CURING SYSTEMS AND METHODS OF MAKING AND USING THEM

[75] Inventor: Cecil L. Phillips, Northampton, England

[73] Assignee: Scott Bader Company Limited, Northamptonshire, England

[21] Appl. No.: 185,589

[22] Filed: Sep. 9, 1980

[30] Foreign Application Priority Data

Sep. 11, 1979 [GB] United Kingdom ................. 7931449

[51] Int. Cl.$^3$ ...................... B32B 17/02; B32B 26/16; C08F 8/00
[52] U.S. Cl. .................................... 428/285; 156/242; 156/275.5; 204/159.15; 204/159.18; 204/159.19; 427/53.1; 427/54.1; 428/40; 428/287; 428/290; 428/295; 428/345; 428/375; 428/913
[58] Field of Search ...................... 204/159.15, 159.22, 204/159.23, 159.18, 159.19; 427/53.1, 54.1; 428/285, 287, 295, 375, 913, 40, 142, 345, 377, 396, 290, 482; 156/242, 275.5

[56] References Cited

U.S. PATENT DOCUMENTS

| | | | |
|---|---|---|---|
| 3,241,997 | 3/1966 | Schutzner | 428/913 X |
| 3,719,539 | 3/1973 | Lamb et al. | 156/199 |
| 3,737,481 | 6/1973 | Vargin et al. | 260/865 |
| 3,867,153 | 2/1975 | MacLachlan | 428/913 X |
| 4,214,026 | 7/1980 | Ibata et al. | 428/67 |

FOREIGN PATENT DOCUMENTS 2831679  5/1979  Fed. Rep. of Germany .

*Primary Examiner*—P. E. Willis, Jr.
*Attorney, Agent, or Firm*—Pearne, Gordon, Sessions, McCoy & Granger

[57] ABSTRACT

A preimpregnated material has a reinforcement substrate impregnated with a thermoset resin mix which includes an initiator susceptible to light in the visible range. The material has cover films in the conventional manner but at least one of them is opaque whereby to protect the material from premature hardening. It gels and cures on exposure to ordinary daylight. The material has wide applicability in patching or locally reinforcing, and in laying-up laminating processes.

A preferred mix has a polyester resin, or small amount of a thickener and a photoinitiator system comprising tribenzylamine, rosin and a benzoyl substituted-oxime carbonate ester.

17 Claims, No Drawings

PREIMPREGNATED MATERIALS COMPRISING VISIBLE-LIGHT CURING SYSTEMS AND METHODS OF MAKING AND USING THEM

FIELD OF THE INVENTION

This invention relates to pre-impregnated unsaturated polyester and other thermoset (i.e. crosslinkable) resin moulding compositions, also known as "prepregs", and methods of using them.

BACKGROUND OF THE INVENTION

Glass reinforcement in the form of mat, woven rovings or fabric has been pre-impregnated with thermoset resins and used in subsequent moulding for many years. Usually the matrix resin in these materials has been cured to the 'B' stage (an intermediate stage of cure) and the impregnated glass fibre material reeled up between layers of cover film, e.g. polyethylene, to prevent layers sticking to one another. Subsequently the material is unrolled, the interleaving film removed, the 'B' stage material cut to the required shape and size and loaded into a mould and cured to the final product by the application of heat and pressure. Attempts were made to cure materials using diallyl phthalate instead of styrene by ultra violet light but were not very successful.

A development in pre-impregnation was the use of chemically thickened unsaturated polyester resins to make sheet moulding compounds ("S M C"). In this process chopped glass fibres or glass mat is impregnated with a mixture of unsaturated polyester resin, filler, catalyst, release agent and a thickening agent such as magnesium oxide. There is a large percentage of filler, this being the cheapest ingredient. Thermoplastic polymers may be added to control shrinkage. The impregnated sheet is compacted and reeled up between layers of polyethylene film. After a short maturing time the material can be unrolled, the polyethylene film removed cleanly and the material cut to size and moulded under heat and pressure. The material in its rolled up state can be comparatively inflexible and unmalleable because it is only more or less roughly cut to size for the mould, and exact conformation to the mould and redistribution of the material of the prepreg will occur under the pressure and heat exerted in the mould.

In DEOS No. 2831679, the invention being described is the provision in a prepreg of special polymeric additives replacing thickeners. These additives are especially provided adjacent the cellophane cover films. The prepreg is stated to have desirable thixotropic properties and to be resistant to air absorption. The prepreg is stated to be cured by sunlight in 1 hour, the photoinitiator used being however an initiater with absorption maxima at 250 and 350 nm, in the ultraviolet. Sunlight as received on the surface of the earth has an ultraviolet content which varies with weather, with air purity and particularly with altitude.

In Example 15 of European Patent Application Publication No. 0007086, published 23rd January, 1980 a reinforced composition containing 40 parts of alumina filler to 60 parts of unsaturated polyester and 1.5% of the resin of MgO thickener is cured by intense exposure to fluorescent tubes. Once more, the initiator used (the object of that invention) is an ultraviolet-sensitive initiator and the process is described as UV curing.

The conclusion drawn is that no preimpregnated material has so far been capable of being cured by light of the visible wavelengths (say 400-800 nm).

SUMMARY OF THE INVENTION

A modified prepreg which could be activated by visible light would have a wide range of application. Since neither pressure nor heat would be needed for its cure it could be used in normal laying-up (lamination) processes, for the application of local reinforcement on a surface of an already formed article or for patching as a repair, to give only a few examples. It would avoid the need for special actinic (UV-rich) light sources which also require their operator to take special safety precautions or wear protective clothing. Furthermore, ordinary glass fibres are almost opaque to UV light. Ordinary daylight could be used to achieve cure throughout the thickness of the material, or ordinary light sources such as tungsten-filament lamps.

The present invention therefore provides a preimpregnated material which is curable by visible light without the use of heat or pressure.

However, since nearly all workplaces will be illuminated by visible light, it provides also for the prevention of premature and unwanted gelation and cure of the resin of the material.

The composition comprises reinforcement material preimpregnated with a composition comprising a crosslinkable resin, a light curing system and a thickener and with an opaque cover film on at least one face.

The thickener, which is present in quite small quantities (say 0.25 to 2.00% by weight, more preferably 0.50 to 1.20% by weight), is an inorganic or organo-metallic compound such as MgO or an aluminium alkoxide. During the so-called maturation period these thickeners form salt complexes within the system and increase its viscosity to a value (say 800-2000 poise) at which it is handleable.

Unsaturated polyesters are the most suitable and economic resin system but others may be used. Typical examples of the various components of such polyester resins that can be used are:

| | | |
|---|---|---|
| (i) | unsaturated acids/anhydrides | maleic anhydride, fumaric, itaconic acid. |
| (ii) | saturated acids/anhydrides | phthalic anhydride, isophthalic acid, terephthalic acid, tetrahydrophthalic anhydride, tetrahalophthalic anhydrides, chlorendic acid/anhydride, adipic acid, sebacic acid. |
| (iii) | glycols | ethylene glycol, 1,2-propylene glycol, 1,3-propylene glycol, diethylene glycol, dipropylene glycol, neopentyl glycol, dibromoneopentyl glycol, Dianol 33 ®, Dianol 22 ®. |
| (iv) | vinyl type monomers as solvent | styrene, vinyl toluene, chlorostyrene, bromostyrene, methyl methacrylate, ethylene glycol dimethacrylate. |

Other resins that can be used are the so-called vinyl esters, made by the reaction of acrylic or methacrylic acid with polyepoxides. These are likewise dissolved in a vinyl type monomer such as styrene.

Various visible light curing systems for unsaturated polyester resins have been proposed, and may be used in the present invention. Examples are benzoin acetals (United Kingdom Pat. Nos. 1429053 and 1509313), α-diketones plus a reducing agent capable of acting on the photo sensitizer when the latter is in an excited state (UK Pat. No. 1408265) and a system comprising (a) at least one benzoyl oxime carbonate ester of the formula (I)

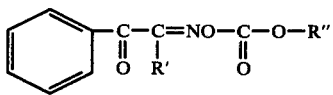

wherein R' and R" are independently alkyl aryl or aralkyl; and (b) at least one photo-reducible dye of the formula

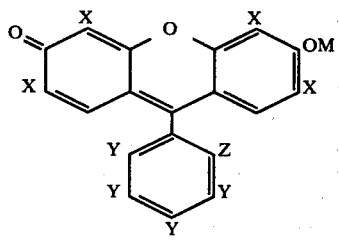

wherein X is independently Br or I and is present on at least two said positions
Y is independently H, Br or I
Z is H, COOM or COOR wherein R is a $C_{1-5}$ alkyl group and
M is H, K, Na, Li or $NH_4$ and (c) at least one reducing agent of the formula

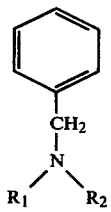

wherein $R_1$ is H, alkyl, hydroxy-substituted alkyl, aryl and aralkyl and $R_2$ is alkyl, hydroxy substituted alkyl, aryl and aralkyl.

The latter system is the subject of European Application No. 79303078.4, published on the 20th August, 1980, under Publication No. 0014293, and of U.S. application Ser. No. 265,916, filed May 21st, 1981 (Alexander et al.), which is a continuation of U.S. application Ser. No. 107779 filed on 28 December 1979. The disclosure of these patents and applications is incorporated herein by reference. In illustration of such visible-light curing systems, these patents and applications teach the above photo-reducible dyes to comprise halogen-substituted dyes, such as, rose bengal and other eosin dyes.

The cover film or films used should be impermeable to the vinyl monomer present in the system, usually styrene, otherwise the material will lose flexibility and pliancy. One suitable film is a polyethylene terephthalate film sold under the name Melinex ®. Such film is available in an opaque form, having been metallized (aluminized) and this is used as the opaque cover film (or one of them).

Glass reinforcement is predominantly used in the industry but this may be replaced in part by carbon fibres, or in part or totally by Kevlar fibres etc. Various types of glass fibre may be combined to tailor the material to the required laminate construction e.g. a mixture of chopped glass fibres, woven rovings and continuous strands used in one pre-impregnated material.

Conventional ingredients may also be present such as fillers (usually in comparatively low quantities, say up to 10% or 20% by weight, because they are light-absorbent), thixotropic agents, release agents.

To make the material, a mat of reinforcing fibre, for example glass fibre, is impregnated with the desired resin.

This is done under dim light that will not activate the curing of the system.

Instead of the conventional polyethylene film the material is wound-up between films at least one of which is a metal foil or of opaque plastic film, to protect it from light of active wavelengths during maturation (1 to 3 days) and storage.

It is also possible to roll the impregnated material up between two different foils or films. For example using an opaque film such as metal foil on one face and a clear film on the other face the material is wound up so that the opaque film is on the outside of the roll.

The product material is a lightly flexible and pliable sandwich having generally parallel faces. It is comparatively thin (about 5 mm or less). It can be conformed by hand pressure only to any surface not having excessively sharp curves or edges.

In use, the material is unwound from the reel and the protective film removed from one face only. The exposed face, which is tacky, is placed in contact with the mould surface and the other film is removed.

Once consolidation is complete further layers can be laid down and consolidated to get a required laminate structure. Curing takes place by irradiating the completed lay-up by light of an active wavelength without the use of heat or pressure. Alternatively each layer may be partially cured so that the outer surface is still slightly tacky and a further layer of material then applied, cross plying if necessary, followed by consolidation. When using a material having one opaque and one clear film, the former is removed and the pre-impregnated material placed against the mould or gel coat surface. After consolidation the material may then be cured by exposure to light through the remaining clear film which is stripped off after cure is complete.

This process can be repeated until the desired laminate thickness has been built up when the whole can be cured to completion.

Although each layer will be fairly thin (approx 5 mm) laminations up to about 1 cm can readily be made.

The surface of the mould may first be covered by a gel coat cured by conventional methods or by light and the pre-impregnated material placed in contact with the back surface of the gel coat instead of direct on to the mould surface.

If the mould is itself transparent or translucent GRP, the material may be irradiated through the mould; this almost totally filters out UV radiation.

The advantages of this material are:
(1) the moulder does not require to add materials such as peroxides or promoters to cure the material,
(2) the material is used in its sheet form and there is no redistribution, (3) the process is much cleaner than normal open lay-up processes, (4) the material is tacky and will stick to anything to which the unthickened and unreinforced resin would have stuck, (5) much less monomer is released to the atmosphere, and (6) a great reduction in lay-up time and thus a faster mould turn round.

In addition to the use of these materials for making moulded shapes they can also be used as repair patches for "do-it-yourself" or professional usage as the material has good adhesion to substrates such as steel, GRP, brick, unplasticised PVC and unglazed earthenware.

DESCRIPTION OF PREFERRED EMBODIMENTS

The invention is illustrated by the following examples:

EXAMPLE 1

A visible-light curing resin was made up as follows:

| | |
|---|---|
| Crystic ® 392 (an isophthalic acid neopentyl glycol based unsaturated polyester) | 97.26 p.b.w. |
| Tribenzylamine | 2.50 p.b.w. |
| Quantacure ® PDO | 0.20 p.b.w. |
| Eosin Y (A polyhalogenated dye) | 0.01 p.b.w. |
| Eosin spirit soluble | 0.03 p.b.w. |

This was converted to a pre-impregnation resin mix as follows:-

| | |
|---|---|
| Light curing resin as above | 92.00 p.b.w. |
| Microdol ® Extra (dolomite filler) | 5.00 p.b.w. |
| Cabosil ® (thixotropic agent) | 2.50 p.b.w. |
| Magnesium Oxide (chemical thickener) | 0.50 p.b.w. |

Quantacure PDO is a compound of the formula (I) above wherein $R_1$ is —$CH_3$ and $R_2$ is —$C_2H_5$.

This mix was employed to impregnate one layer of glass fibre tissue and 1 layer of 600 g/m² chopped strand glass fibre mat on a standard S.M.C. impregnating machine at a resin glass ratio of 2.5/1 and reeled up between 1 layer of clear Melinex ® film and 1 layer of aluminized Melinex ® film with the metallised film on the outside. After 24 hours maturation the viscosity of the prepreg had increased to the required degree and the material was ready for use. The shelf life of this material was in excess of 6 months.

Its use as a repair material was demonstrated by lightly abrading a split unplasticised PVC pipe and applying a piece of the above prepreg after removing the two Melinex films. After pressing the tacky material in contact with the damaged pipe it was irradiated with tungsten light for 30 minutes which completely cured the patch.

EXAMPLE 2

A light curing resin mix was made up as follows:

| | |
|---|---|
| Crystic ® 196 (a maleic/phthalic/propylene glycol based unsaturated polyester resin) | 97.37 p.b.w. |
| Tribenzylamine | 2.50 p.b.w. |
| Quantacure ® PDO | 0.10 p.b.w. |
| Eosin Y | 0.03 p.b.w. |

From this a pre-impregnation mix was made according to the following formulation:

| | |
|---|---|
| Light curing resin as above | 95.95 p.b.w. |
| Cabosil ® (thixotropic agent) | 2.00 p.b.w. |
| Polypropylene glycol (2000 MW) | 0.05 p.b.w. |
| Aluminium Octoate (chemical thickener) | 1.50 p.b.w. |
| Magnesium Oxide (chemical thickener) | 0.50 p.b.w. |

This mix was used to impregnate 1 layer of chopped strand glass fibre mat (450 g/m²), 1 layer of woven glass fibre rovings (600 g/m²) and a further layer of chopped strand glass fibre mat (450 g/m²), at a resin glass ratio of 2/1 using a standard S.M.C. impregnating machine. The prepreg was wound up between 1 layer of clear Melinex ® film and 1 layer of aluminised Melinex ® film, the metallised film being on the outside. After 24 hours maturation the prepreg was ready for use and had a shelf life in excess of 6 months.

The material was used to make a small dinghy hull by firstly applying a layer of release agent to the mould. When this had dried a layer of catalysed gelcoat (Crystic ® GC65) 0.015" (approx 0.4 mm) was applied over the mould surface. When this had cured sufficient pre-impregnated material was unwound and the clear film removed from one side and placed in the mould. It was rolled to take up the conformation of the mould, the outer metallised film removed and placed outside in daylight. The prepreg cured in 20 minutes and the dinghy was removed from the mould after 1 hour.

EXAMPLE 3

A pre-impregnation mix was made as follows:

| | |
|---|---|
| Crystic ® 196 | 500 g |
| Benzil | 5 g |
| Tribenzylamine | 12.5 g |
| Magnesium Oxide | 10 g |

This mix was used to impregnate 2 layers 450 g/m² chopped strand glass mat using a standard SMC machine and rolled up between two Melinex ® films, the outer one of which was metallised and opaque.

After storage for 3 days for maturation, a clear flexible prepreg was obtained and the viscosity of the resin had increased considerably so that it did not drain from the glass fibre.

A sample measuring 12×10 cms was cut from the prepreg and the metallised film removed to expose a smooth but tacky surface. This surface was pressed firmly on the outside of a metal can which had several holes in it. The clear film was left in place and the patch was exposed to sunlight for 30 minutes. The clear film was peeled off and the patch had a tack-free smooth surface, adhered well to the metal surface and the repair was watertight.

EXAMPLE 4

A pre-impregnation mix was made as follows:

| | Parts by weight |
|---|---|
| Crystic ® 196 | 91.825 |
| Tribenzylamine | 2.36 |
| Eosin Spirit soluble | 0.04 |
| Eosin Y | 0.04 |
| Quantacure PDO | 0.185 |
| Aluminium Octoate | 3.00 |
| Cabosil | 2.00 |
| Magnesium Oxide | 0.50 |

| | Parts by weight |
|---|---|
| Polypropylene Glycol 2000 | 0.05 |

A light curable prepreg was made by using this mix to impregnate 2 layers 450 g/m² chopped strand glass mat so as to obtain a resin/glass ratio of 1.9/1.0. The prepreg was wound up between two Melinex ® films, one of which was metallised and opaque.

After maturation the prepreg was used to reinforce a small vacuum-formed perspex shape 1 mm thick. After removing the outer metallised film the prepreg was pressed against the shape so that it conformed to the shape and then exposed to daylight through the clear Melinex ® film for 1 hour. The reinforced polyester layer was well cured and was found to be strongly adhered to the vacuum-formed perspex shape and had significantly increased the rigidity of the shape.

I claim:

1. A thin, pliable prepreg material comprising:
   (a) a reinforcing substrate having generally parallel faces,
   (b) a resin mix impregnating said substrate, the resin mix comprising,
      (i) a thermosetting hardenable resin,
      (ii) an initiator therefor susceptible to visible light, and
      (iii) a thickener therefor to increase the viscosity of the resin mix to a value in the range of about 800 to about 2000 poise at which said prepreg material is handleable, and
   (c) a cover film opaque to visible light, said resin mix being tacky and separably adhering said cover film along a face of the impregnated substrate, said cover film being separable from the reinforcing substrate prior to curing the thermosetting hardenable resin.

2. A prepreg as claimed in claim 1 further comprising:
   (d) a second cover film adhered along the other face of the impregnated substrate.

3. A prepreg as claimed in claim 1 wherein the reinforcing substrate is a non-woven mat of glass fibres.

4. A prepreg as claimed in claim 1 wherein the thickener is selected from the group consisting of inorganic and organometallic compounds.

5. In a sandwich preimpregnated moulding material comprising a reinforcing substrate impregnated with a thermoset resin mix curable by irradiation with electromagnetic radiation due to the presence in said mix of a solvent monomer and an initiator, and protective films on each face the improvement comprising a said initiator susceptible to radiation in the visible range and at least one of said films being opaque to visible light.

6. The improvement claimed in claim 5, wherein the said initiator comprises:
   (a) at least one benzoyl oxime carbonate ester of the formula

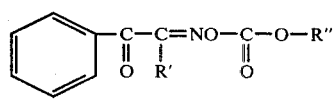

wherein R' and R" are independently alkyl, aryl or aralkyl;
   (b) at least one photo-reducible dye; and
   (c) at least one N,N-disubstituted benzylamine reducing agent.

7. The improvement claimed in claim 6, wherein said at least one photo-reducible dye is capable of absorbing electromagnetic radiation in the visible region to raise it to an excited state for reaction with said at least one reducing agent.

8. The improvement claimed in claim 6 or 7, wherein said at least one photo-reducible dye is polyhalogenated.

9. The improvement claimed in claim 6, wherein said at least one photo-reducible dye is an eosin dye.

10. The improvement claimed in claim 5, wherein the said initiator comprises:
    (a) at least one benzoyl oxime carbonate ester of the formula

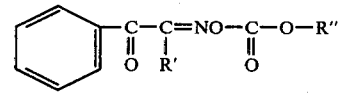

wherein R' and R" are independently alkyl, aryl or aralkyl; and
    (b) at least one photo-reducible dye comprising rose bengal dye; and
    (c) at least one reducing agent of the formula

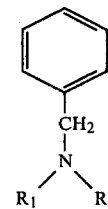

wherein $R_1$ is H, alkyl, hydroxy-substituted alkyl, aryl and aralkyl and $R_2$ is alkyl, hydroxy-substituted alkyl, aryl and aralkyl.

11. The improvement claimed in claim 5 wherein the said initiator comprises:
    (a) at least one benzoyl oxime carbonate ester of the formula

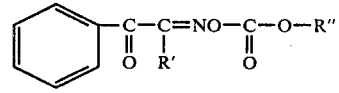

wherein R' and R" are independently alkyl, aryl or aralkyl; and
    (b) at least one photo-reducible dye of the formula

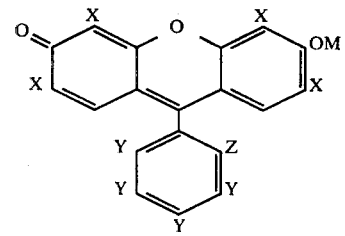

wherein X is independently Br or I and is present on at least two said positions Y is independently H, Br or I Z is H, COOM or COOR wherein R is a $C_{1-5}$ alkyl group and M is H, K, Na, Li or $NH_4$; and (c) at least one reducing agent of the formula

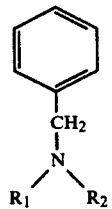

wherein $R_1$ is H, alkyl, hydroxy-substituted alkyl, aryl and aralkyl and $R_2$ is alkyl, hydroxy substituted alkyl, aryl and aralkyl.

12. The improvement claimed in claim 5 wherein the said at least one film is a metallized film impermeable to the solvent monomer of the resin mix.

13. The improvement claimed in claim 5 wherein the resin mix further comprises a small amount of a thickener selected from the group consisting of magnesium oxide and aluminium alkoxides.

14. A method of forming a cured, reinforced shaped article from a prepreg comprising
 (i) taking a selected length of said prepreg,
 (ii) stripping from at least one face thereof a protective cover film to expose a tacky surface of an impregnated substrate,
 (iii) conforming the prepreg to a surface by hand pressure whereby the tacky surface adheres to the surface and
 (iv) exposing the prepreg to visible light to cause gelation and cure of a resin mix impregnating the substrate.

15. A method as claimed in claim 14 wherein the film removed is a film opaque to visible light.

16. A method as claimed in claim 15 wherein the prepreg is irradiated through the said surface.

17. A method as claimed in claim 14 wherein the said length is taken from a roll of material, the said cover film being opaque to light and being on the face of the prepreg of greater radius in the roll.

* * * * *